United States Patent
Kuchiyama

(10) Patent No.: US 11,222,787 B2
(45) Date of Patent: Jan. 11, 2022

(54) PATTERNING SHEET AND ETCHED STRUCTURE PRODUCTION METHOD

(71) Applicant: KANEKA CORPORATION, Osaka (JP)

(72) Inventor: Takashi Kuchiyama, Settsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/808,178

(22) Filed: Mar. 3, 2020

(65) Prior Publication Data

US 2020/0203170 A1 Jun. 25, 2020

Related U.S. Application Data

(63) Continuation of application No. PCT/JP2018/020055, filed on May 24, 2018.

(30) Foreign Application Priority Data

Sep. 22, 2017 (JP) ............................. JP2017-182393

(51) Int. Cl.
| | |
|---|---|
| *H01L 21/306* | (2006.01) |
| *B05D 1/34* | (2006.01) |
| *B05D 3/10* | (2006.01) |
| *C09K 13/04* | (2006.01) |
| *C23F 1/02* | (2006.01) |
| *C23F 1/14* | (2006.01) |
| *H01L 21/027* | (2006.01) |
| *H01L 21/3213* | (2006.01) |
| *H01L 49/02* | (2006.01) |

(52) U.S. Cl.
CPC .............. *H01L 21/306* (2013.01); *B05D 1/34* (2013.01); *B05D 3/10* (2013.01); *C09K 13/04* (2013.01); *C23F 1/02* (2013.01); *C23F 1/14* (2013.01); *H01L 21/027* (2013.01); *H01L 21/3213* (2013.01); *H01L 28/26* (2013.01)

(58) Field of Classification Search
CPC ..... H01L 21/306; H01L 28/26; H01L 21/027; H01L 21/3213; H01L 21/32134; B05D 1/34; B05D 3/10; C09K 13/04; C23F 1/02; C23F 1/14; C23F 1/18
USPC .................................................. 252/79.1–79.4
See application file for complete search history.

(56) References Cited

U.S. PATENT DOCUMENTS

| | | | |
|---|---|---|---|
| 2007/0042693 A1* | 2/2007 | Saikin ................ | B24D 18/0009 451/527 |
| 2008/0210660 A1 | 9/2008 | Stockum et al. | |

FOREIGN PATENT DOCUMENTS

| | | | |
|---|---|---|---|
| JP | S52-120003 A | | 10/1977 |
| JP | H08-130213 A | | 5/1996 |
| JP | 2004075700 A | * | 3/2004 |

(Continued)

OTHER PUBLICATIONS

International Search Report issued in PCT/JP2018/020055; dated Jul. 24, 2018.

*Primary Examiner* — Duy Vu N Deo
(74) *Attorney, Agent, or Firm* — Studebaker & Brackett PC

(57) ABSTRACT

A patterning sheet, or the like, is suitable when a complex etching target is to be etched in a simple manner to produce an etched structure. This patterning sheet comprises a base sheet formed from an etching-solution permeable first polymer, and particles dispersed in the base sheet and formed from a second polymer, which absorbs and holds the etching solution.

8 Claims, 4 Drawing Sheets

(56) References Cited

FOREIGN PATENT DOCUMENTS

| | | | |
|---|---|---|---|
| JP | 2007-053384 | A | 3/2007 |
| JP | 2008-547232 | A | 12/2008 |
| KR | 10-2007-0021930 | A | 2/2007 |

* cited by examiner

PATTERNING SHEET AND ETCHED STRUCTURE PRODUCTION METHOD

CROSS-REFERENCE TO RELATED APPLICATIONS

This application claims benefit of priority to International Patent Application No. PCT/JP2018/020055, filed May 24, 2018, and to Japanese Patent Application No. 2017-182393, filed Sep. 22, 2017, the entire contents of each are incorporated herein by reference.

BACKGROUND

Technical Field

The present disclosure relates to a patterning sheet and an etched structure production method.

Background Art

In an electronic device such as a display device, a touch screen, or a photoelectric conversion element, a structure has been complicated in accordance with the progress of a technology. In particular, a circuit is remarkably miniaturized in an in-plane direction of a substrate or the like, and fine patterning of nano-order can be technically performed. In addition, in the electronic device, many substrates and the like having a three-dimensional structure in which depressions and protrusions are provided to the plane (etched structures) have been developed in order for higher-density mounting or a stereoscopic optical effect.

SUMMARY

However, it is extremely cumbersome to selectively perform an etching treatment with respect to a part of a three-dimensional structure in an etching target that is a target before etching, for example, only a vertex of a protrusion on a depression-protrusion surface. For example, in the case of an etching method using an etching paste, as with Japanese Unexamined Patent Application (Translation of PCT Application), Publication No. 2008-547232, it is necessary to use the etching paste in the positioning of the vertex of the protrusion, and thus, the process is extremely complicated.

In addition, as illustrated in FIG. 7, there is also a method of bringing a substrate 120B having a three-dimensional structure into contact with an etching-solution 113. However, in this method, the etching-solution 113 spreads to not only the vertex of the protrusion but also a bottom of a depression (refer to a black arrow) by a surface tension of the etching-solution 113, and thus, the etching-solution 113 may be infiltrated into the substrate 120B.

In addition, in this method, in a case where the etching-solution 113 has volatility, as described above, the etching-solution 113 may be infiltrated into the substrate 120B by a volatile component. In addition, it is necessary to maintain the silence of a liquid surface, and thus, it is not suitable for a consecutive etching treatment, and productivity decreases.

Accordingly, the present disclosure provides a patterning sheet or the like that is suitable in a case where a complex etching target is etched in a simple manner to produce an etched structure.

A patterning sheet according to the present disclosure, includes (A) a base sheet formed from an etching-solution permeable first polymer; and (B) particles dispersed in the base sheet and formed from a second polymer that absorbs and holds the etching-solution.

In addition, an etched structure production method in which the etched structure is produced by etching an etching target, includes a contact step of bringing a surface side of a patterning sheet into contact with a surface to be etched of the etching target; and a detachment step of detaching the surface side from the surface to be etched.

According to the patterning sheet of the present disclosure, a complex etching target is etched in a simple manner to produce an etched structure.

DETAILED DESCRIPTION

Figure 1:
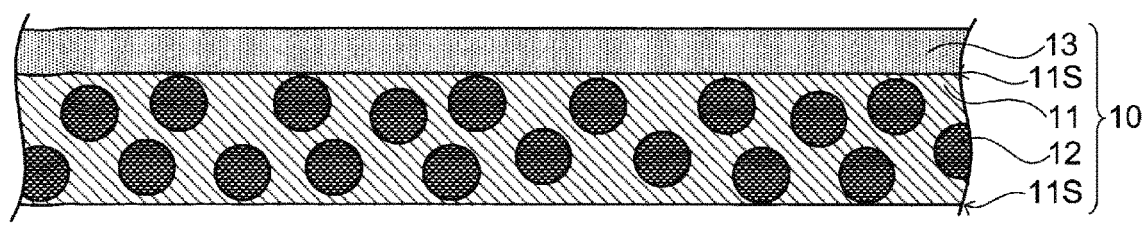
FIG. 1 is a sectional view describing the inside of a patterning sheet.

One embodiment of the present disclosure will be described as below, but the present disclosure is not limited thereto. Note that, there is a case where hatching, member reference numerals, and the like are omitted for convenience sake, but in such a case, other drawings will be referred to. In addition, the dimension of various members in the drawings is adjusted to be easily viewable, for convenience sake.

Figure 2:
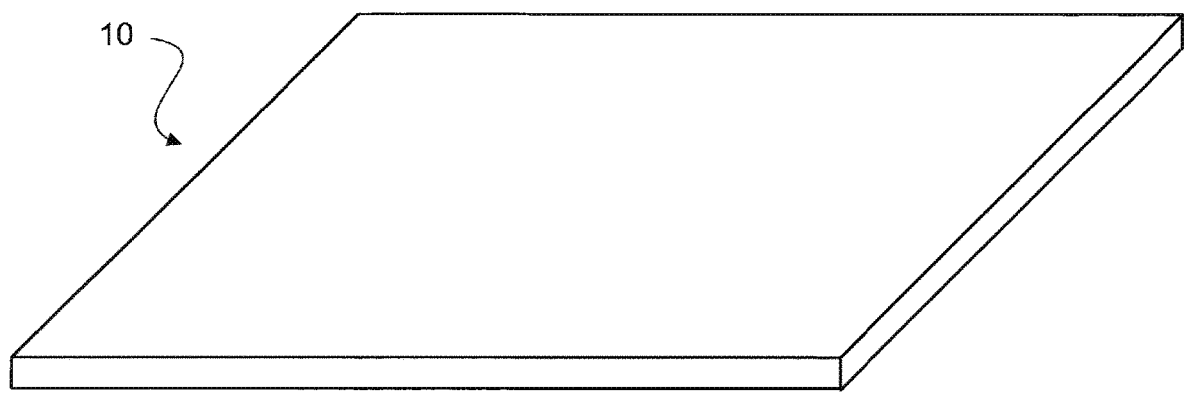
FIG. 2 is a perspective view of the patterning sheet.
Figure 3:
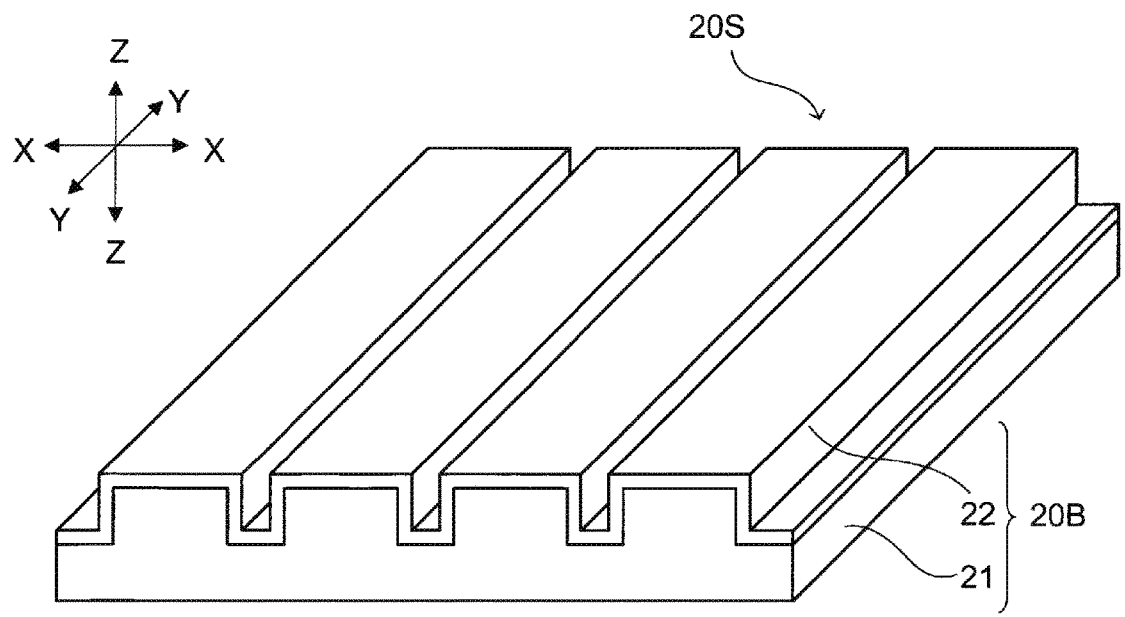
FIG. 3 is a perspective view of an etching target that is etched by using the patterning sheet.
Figure 4:
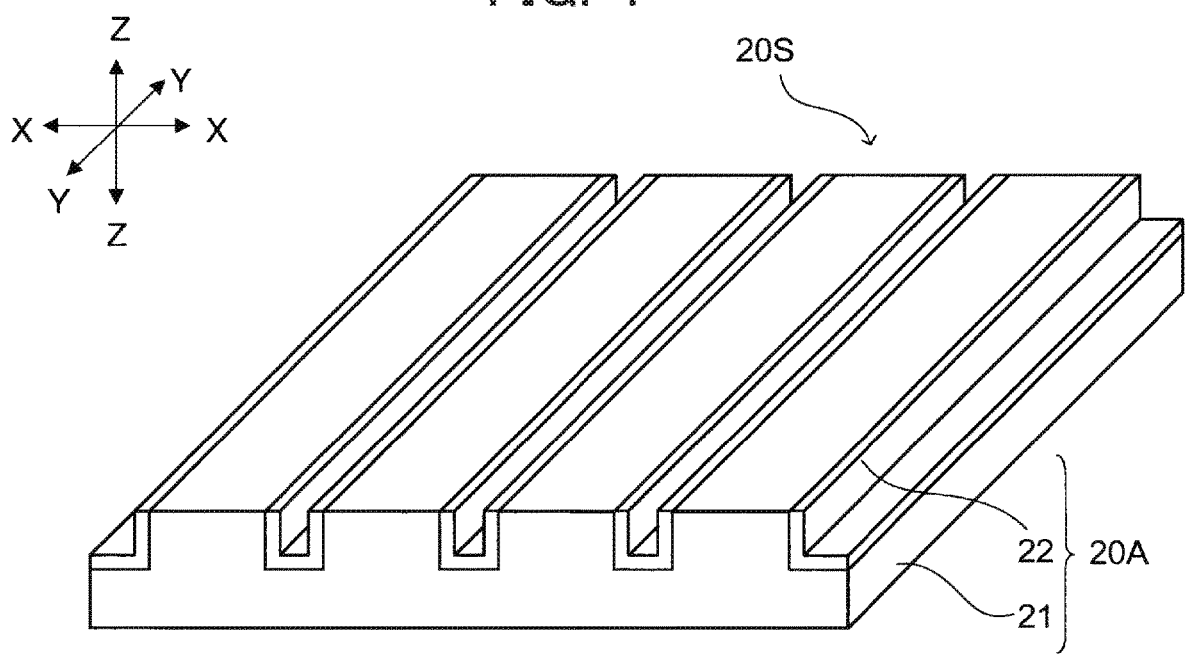
FIG. 4 is a perspective view of an etched structure that is produced by etching the etching target.

FIG. 1 is a sectional view describing the inside of a patterning sheet 10, and FIG. 2 is a perspective view of the patterning sheet 10. FIG. 3 is a perspective view of an etching target 20B that is etched by using the patterning sheet 10, and FIG. 4 is a perspective view of an etched structure 20A that is produced by etching the etching target 20B.

<Etching Target and Etched Structure>

As illustrated in FIG. 3, the etching target 20B is an object having depressions and protrusions in an on-plane direction of a plane that is formed in two dimensions of an X direction and a Y direction, that is, a Z direction (hereinafter, such an object may be referred to as a three-dimensional structure). Then, the etching target 20B in which a predetermined portion is etched with respect to a portion having a plurality of depressions and protrusions disposed therein (a surface 20S to be etched) is set to the etched structure 20A. Note that, examples of such an etching target 20B include a resin molded body or a semiconductor substrate.

In addition, in the etching target 20B that is the three-dimensional structure, it is preferable that a height difference between a vertex and a bottom of a depression and a protrusion in a two-dimensional surface (an XY surface) is greater than or equal to 10 μm. In addition, it is preferable that the height difference is at a comparable level over the entire two-dimensional surface, and further, it is preferable that there is periodicity in the depressions and protrusions, in an in-plane direction of the two-dimensional surface. This is because in such an etching target 20B, uniform etching can be performed with respect to the surface 20S to be etched.

Note that, the pattern of the depressions and protrusions is not particularly limited, but examples of the pattern include a line-and-space pattern, a dot pattern, grating pattern, or an arabesque pattern.

In addition, a method of providing the depressions and protrusions is not particularly limited, and for example, printing may be performed with respect to a base material 21, or cutting may be performed with respect to the base material 21 by a laser, an electron beam, or the like. In addition, the depressions and protrusions may be provided from an initial state of the base material 21 by molding. In particular, a molding method is preferable from the viewpoint of the uniformity of a depression and protrusion shape and the productivity of the etching target 20B.

Examples of the molding method include an imprint method. In the imprint method, a mold (a metallic mold) is used in which an inverted structure having a three-dimensional structure is carved. Specifically, a film material such as a thermoplastic resin or an ultraviolet curable material is applied onto a base material, and the coated surface is pressed to the mold, and thus, the depressions and protrusions are provided. Then, the base material is released from the mold after the film material is cured, and thus, the etching target 20B that is a three-dimensional structure is completed.

Note that, a portion to which the depressions and protrusions are provided is not limited to the film material, but for example, the depressions and protrusions are provided to the material of the base material 21, insofar as the base material 21 itself is a thermoplastic film. That is, it is also possible to directly provide the depressions and protrusions to the film (note that, FIG. 3 is an example in which the depressions and protrusions are provided to the base body 21).

It is sufficient that a material suitable for the imprint method is a thermoplastic resin, and examples of the material include an acrylic resin such as polymethyl methacrylate, or an ABS resin, and further, a polyolefin-based resin such as polypropylene or polycycloolefin, or elastomers.

In addition, examples of the ultraviolet curable material include a silicon compound such as hydrogenated silsesquioxane. Note that, optical properties or a mechanical strength may be provided by adding an oxide of a metal such as titanium, silicon, aluminum, yttrium, or zirconium to the silicon compound.

As illustrated in FIG. 3, a functional thin film 22 that provides electrical properties, optical properties, or magnetic properties to the etching target 20B is formed on a depression-protrusion surface that is formed as described above.

Examples of a material that provides the electrical properties include not only a metal such as copper, silver, nickel, or tungsten, or an alloy thereof, but also a transparent conductive oxide such as indium oxide or zinc oxide.

In addition, examples of a material that provides the optical properties include silicon oxide, niobium oxide, silicon nitride, or the like.

In addition, examples of a material that provides the magnetic properties include a magnetic material formed from an alloy of neodymium, cobalt, iron, boron, or the like, a strongly correlated compound formed from an oxide, or the like.

A part of the depression-protrusion surface (the surface 20S to be etched) on which such a functional thin film 22 is laminated is etched by the patterning sheet 10 described below, but it is preferable that the thickness of the functional thin film 22 is a thickness that does not fill the height difference of the depressions and protrusions, and it is preferable that the thickness is less than or equal to 1/10 with respect to the height difference.

In addition, for example, a film that ensures adhesion (an adhesion improving film) may be formed with respect to the depression-protrusion surface after etching, and another functional thin film may be formed with respect to the adhesion improving film. That is, adhesion between the depression-protrusion surface and another functional thin film may be ensured by the adhesion improving film.

Note that, examples of a method of forming the functional thin film as described above include not only a dry film-forming method such as chemical vapor deposition (CVD) and physical vapor deposition (PVD) such as sputtering or vapor deposition, but also a wet film-forming method such as a printing method.

<Patterning Sheet>

Here, the patterning sheet 10 for etching the etching target 20B as described above will be described.

As illustrated in FIG. 2, the patterning sheet 10 is a planar sheet. Then, as illustrated in FIG. 1, the patterning sheet 10 includes (A) a base sheet 11, and (B) particles 12 that are dispersed in the base sheet 11. By including (A) and (B), (C) a surface film 13 formed by exposing an etching-solution that is absorbed and held by the particles 12 to a main surface 11S of the base sheet 11 is formed on the patterning sheet 10.

Note that, a position in which the surface film 13 is formed may be at least one of two main surfaces 11S and 11S of the base sheet 11. Hereinafter, in order to facilitate understanding, the description will be made by using an example in which the surface film 13 is formed only one surface 11S of two main surfaces 11S and 11S, and the other surface 11S is coated to suppress the exposure of the etching-solution (not illustrated).

[(A) Base Sheet]

The base sheet 11 is formed from a resin that a treatment liquid such as the etching-solution easily permeates (hereinafter, the fact that the treatment liquid easily permeates the resin will be referred to as having high liquid permeability). In addition, modified polymers that easily disperse particles are preferable, and in particular, a polymer containing silicone modified polyether as a main component is preferable, as the resin that forms the base sheet 11 (hereinafter, also referred to as a matrix resin), from the viewpoint of dispersing the particles 12.

Note that, herein, containing a certain substance as a "main component" indicates that the content of the substance is greater than or equal to 51 weight %, is preferably greater than or equal to 70 weight %, and is more preferably 90 weight %. In addition, unless the functions of the present disclosure are lost, substances other than the main components may be contained.

Here, silicone-modified polyether that is contained in the material of the base sheet 11 [First Polymer] as a main component will be described in detail.

Such silicone-modified polyether contains (1) a polymer, (2) a crosslinkable compound, and (3) a catalyst. Then, such a composition is cured, and thus, the base sheet 11 is formed.

The polymer (1) is a polyether-based polymer having an alkenyl group. Specifically, the polymer (1) is a polyether-based polymer having one or more alkenyl groups on at least a terminal end of the polymer (1). The alkenyl group is not particularly limited insofar as the alkenyl group is a group having a carbon-carbon double bond that is active with respect to a hydrosilylation reaction.

Examples of the alkenyl group include an aliphatic unsaturated hydrocarbon group having preferably 2 to 20 carbon atoms, and more preferably 2 to 4 carbon atoms. Specific examples of the alkenyl group include, for example, a vinyl group, an allyl group, a methyl vinyl group, a propenyl group, a butenyl group, a pentenyl group, and a hexenyl group, a cyclic unsaturated hydrocarbon group having preferably 3 to 20 carbon atoms, and more preferably 3 to 6 carbon atoms, such as for example, a cyclopropenyl group, a cyclobutenyl group, a cyclopentenyl group, a cyclohexenyl group, and the like, a methacrylic group, or the like.

Preferred examples of the alkenyl group include ($\alpha$) and ($\beta$) described below, from the viewpoint of easily performing a synthesis reaction. In the following formula, $R^1$ is a hydrogen atom or a hydrocarbon group having 1 to 10 carbon atoms, and is preferably a hydrogen atom or a methyl group.

$H_2C=C(R^1)—$      ($\alpha$)

$HC(R^1)=CH—$      ($\beta$)

The polymer (1) has at least one alkenyl group, preferably 1 to 5 alkenyl groups, and more preferably 1 to 3 alkenyl group, on average, in one molecule. There is a tendency that curing properties of the polymer (1) are insufficient in a case where the number of alkenyl groups in one molecule is less than 1, on average.

Typical examples of the polyether-based polymer that is a basic skeleton of the polymer (1) include a polyoxyalkylene-based polymer having a repeating unit represented by a general formula of $(-R^2-O-)$. Here, $-R^2-$ is a divalent alkylene group. A preferred main chain of the polymer (1) is polyoxypropylene, that is, $-R^2-$ described above is $-CH_2CH(CH_3)-$, from the viewpoint of workability on availability. The polyether-based polymer may have one type of repeating unit, or may have a plurality of repeating units. The polyether-based polymer may be a straight-chain polymer, or may be a branched polymer.

It is preferable that all portions of the polymer (1) other than the alkenyl group are formed from a polyether skeleton, but the polymer (1) may have other structure units. In this case, the sum of the polyether skeletons in the polymer (1) is preferably greater than or equal to 80 weight %, and is more preferably greater than or equal to 90 weight %.

In addition, a number average molecular weight of the polymer (1) is preferably 3,000 to 50,000, is more preferably 6,000 to 50,000, and is particularly preferably 10,000 to 30,000, from the viewpoint of workability at a room temperature. In a case where the number average molecular weight is less than 3000, a cured material to be obtained tends to be brittle, whereas in a case where the number average molecular weight is greater than 50000, a viscosity increases, and thus, the workability tends to decrease. Note that, the molecular weight is a number average molecular weight in terms of polystyrene that is measured by size exclusion chromatography.

In addition, a chemical bond linking the alkenyl group with the polyether-based polymer is not particularly limited, and examples of the chemical bond include a direct bond of an alkenyl group, an ether bond, an ester bond, a carbonate bond, a urethane bond, or a urea bond.

In addition, a production method of the polymer (1) is not particularly limited, and for example, a method of obtaining a polyether-based polymer, and then, of introducing an alkenyl group is exemplified. In this case, various known production methods can be applied to the polyether-based polymer, and further, a commercially available polyether-based polymer may be used.

In addition, a method of introducing the alkenyl group to the polyether-based polymer is also known. Examples of the method of introducing the alkenyl group to the polyether-based polymer include a method of copolymerizing a monomer having an alkenyl group (for example, allyl glycidyl ether) and a monomer for synthesizing a polyether-based polymer, a method of allowing a compound having both of a functional group and an alkenyl group that are reactive with respect to a functional group (for example, a hydroxyl group and an alkoxide group) (for example, an acrylic acid, a methacrylic acid, vinyl acetate, acrylic acid chloride, and the like) to react with a polyether-based polymer in which the functional group is introduced in advance to a desired portion (a terminal of a main chain, or the like), or the like.

Next, the crosslinkable compound (2) will be described. The crosslinkable compound (2) is an organohydrosiloxane compound having a hydrosilyl group. Specifically, the crosslinkable compound (2) is an organohydrosiloxane compound having 1 to 10 hydrosilyl groups per molecule.

The hydrosilyl group indicates a group having a Si—H bond. Herein, in a case where two hydrogen atoms (H) are bonded to the same silicon atom (Si), the number of hydrosilyl groups is calculated as 2. A chemical structure of the crosslinkable compound (2) other than the hydrosilyl group is not particularly limited.

A number average molecular weight of the crosslinkable compound (2) that is calculated from a SiH group value obtained by titration is preferably 400 to 3,000, and is more preferably 500 to 1,000. In a case where the number average molecular weight is excessively low, the crosslinkable compound is easily volatilized at the time of heating and curing, and there is a tendency that it is difficult to obtain a sufficiently cured material, and in a case where the number average molecular weight is excessively high, a curing rate tends to be slow.

The number of hydrosilyl groups contained in one molecule of the crosslinkable compound (2) is 1 to 10, and is preferably 2 to 8. In a case where the number of hydrosilyl groups is greater than or equal to 2, it is possible to crosslink a plurality of molecules of the polymer (1) at the time of curing. Here, in a case where the number of hydrosilyl groups excessively increases, the stability of the crosslinkable compound (2) is degraded. In addition, a large amount of hydrosilyl groups remain in the cured material even after curing, and therefore, there is a possibility that an adverse effect is applied to etching properties.

Coarseness and denseness of crosslinkage affect coarseness and denseness between polyether portions that comprise the main chain of the polymer (1), and further, also affect liquid permeability. Accordingly, the number of hydrosilyl groups of the crosslinkable compound (2) should be selected in consideration of a balance with respect to the liquid permeability. In addition, the crosslinkable compound (2) may be independently used, or two or more types thereof may be used together. In addition, a crosslinkable compound having excellent compatibility with respect to the polymer (1) is preferable as the crosslinkable compound (2).

Organohydrogen siloxane that is modified by an organic group is exemplified as the suitable crosslinkable compound (2), from the viewpoint of the availability of raw material or compatibility with respect to the polymer (1). A typical example of the organohydrogen siloxane is a compound represented by ($\gamma$) described below.

[Chem. 1]

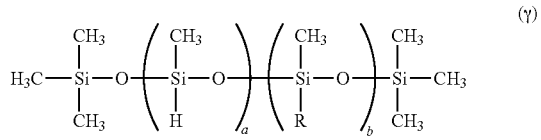

The value of a of (γ) described above is coincident with the number of hydrosilyl groups per molecule of the crosslinkable compound (2). The value of a+b is not particularly limited, but is preferably 2 to 50. R is a hydrocarbon group having 2 to 20 carbon atoms in a main chain.

The compound of (γ) described above can be obtained by modifying unmodified methyl hydrogen silicone, and by introducing R. The unmodified methyl hydrogen silicone corresponds to a compound in which all Rs are H in (γ) described above, as also described in "Silicone Market Outlook-Manufacturer Strategy and Development of Application" (1990.1.31) published by CMC Publishing Co., Ltd., is used as a raw material of various modified silicones.

Examples of an organic compound for introducing R include α-olefin, styrene, α-methyl styrene, allyl alkyl ether, allyl alkyl ester, allyl phenyl ether, allyl phenyl ester, and the like. The number of hydrosilyl groups per molecule after modification can be adjusted in accordance with the amount of organic compound described above that is added for modification.

A ratio of the amount of polymer (1) and the amount of crosslinkable compound (2) is represented by the total amount of hydrosilyl groups derived from crosslinkable compound (2) with respect to the total amount of alkenyl groups derived from the polymer (1). It is determined whether to increase or decrease a crosslinking density after curing, in accordance with the magnitude of the total amount of hydrosilyl groups per 1 mol of the total amount of alkenyl groups in a pressure-sensitive adhesive composition. The total amount of hydrosilyl groups per 1 mol of the total amount of alkenyl groups is preferably 0.3 mol to 0.8 mol, and is more preferably 0.4 mol to 0.7 mol, in consideration of appropriate liquid permeability.

Next, the catalyst (3) will be described. A hydrosilylation catalyst that is the catalyst (3) is not particularly limited, but an arbitrary catalyst can also be used insofar as the catalyst prompts a hydrosilylation reaction.

For example, an example of the catalyst (3) includes a platinum-vinyl siloxane catalyst. Specifically, hydrogen chloroplatinate, a platinum-vinyl siloxane complex, for example, a platinum-1,3-divinyl-1,1,3,3-tetramethyl disiloxane complex, or a platinum-1,3,5,7-tetravinyl-1,3,5,7-tetramethyl cyclotetrasiloxane complex, a platinum-olefin complex, for example, $Pt_x(ViMe_2SiOSiMe_2Vi)_y$ and $Pt[(Me-ViSiO_4]_z$ where, x, y, and z represent a positive integer, and the like are exemplified.

Among the catalysts described above, a platinum complex catalyst that does not contain a strongly acidic conjugate base as a ligand is preferable, a platinum-vinyl siloxane complex is more preferable, a platinum-1,3-divinyl-1,1,3,3-tetramethyl disiloxane complex, or a platinum-1,3,5,7-tetravinyl-1,3,5,7-tetramethyl cyclotetrasiloxane complex is particularly preferable from the viewpoint of active of the catalyst.

The amount of catalyst (3) is not particularly limited, but is preferably $10^{-8}$ mol to $10^{-1}$ mol, and is more preferably $10^{-6}$ mol to $10^{-3}$ mol, with respect to 1 mol of the total amount of alkenyl groups of the polymer (1). In such a range, a suitable curing rate, stable curing properties, the ensuring of necessary pot life, and the like are easily attained.

The base sheet 11 formed from such a material [First Polymer] has a suitable thickness, but this is strongly linked to the particles 12, and thus, the details will be described below.

[(B) Particles and (C) Surface Film]

Next, the particles 12 and the surface film 13 will be described. The particles 12 are formed from a polymer having liquid holding properties. Then, such particles 12 hold the etching-solution therein and discharge the etching-solution from the matrix resin after being dispersed in the matrix resin. Then, the discharged etching-solution is the surface film 13 on the main surface 11S of the base sheet 11.

Figure 5A:
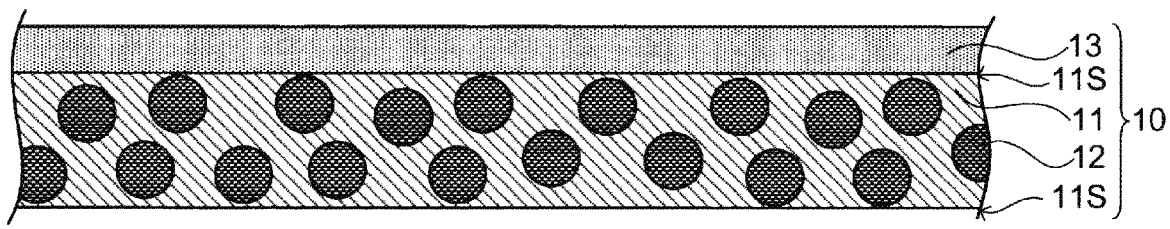
FIG. 5A is a sectional view illustrating a step of producing the etched structure from the etching target.
Figure 5B:
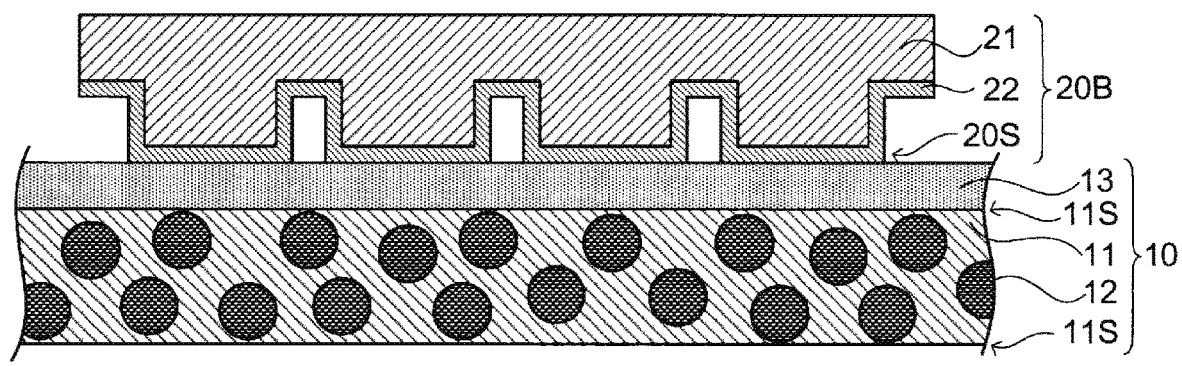
FIG. 5B is a sectional view illustrating a step of producing the etched structure from the etching target.
Figure 5C:
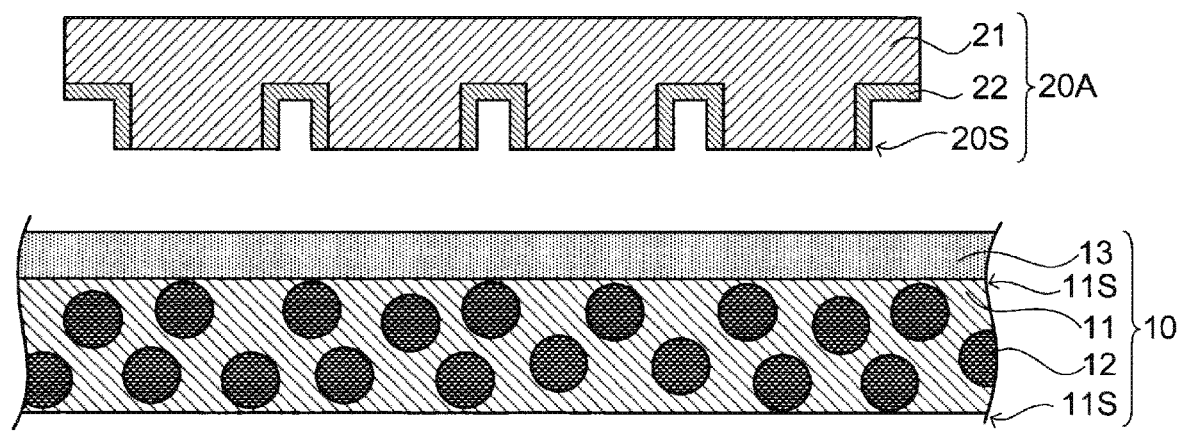
FIG. 5C is a sectional view illustrating a step of producing the etched structure from the etching target.

Then, in a case where depression-protrusion surface (the surface 20S to be etched) on which the functional thin film 22 of the etching target 20B is laminated is in contact with the patterning sheet 10 including the surface film 13 formed on the base sheet 11 in which the particles 12 are dispersed as illustrated in FIG. 5A, [Contact Step] as illustrated in FIG. 5B, the etching-solution of the surface film 13 is attached to the functional thin film 22 that is formed on the vertexes of the protrusions. After that, in a case where the surface film 13 and the surface 20S to be etched are detached from each other [Detachment Step], as illustrated in FIG. 5C, only the attached portion is dissolved, and thus, the etched structure 20A is completed. Note that, after that, it is preferable to perform a rinsing step of removing and washing the surface 20S to be etched.

It is preferable that the particles 12 are formed from a porous material in order to attain a function of holding and discharging the etching-solution. Specific porous properties can be expressed by a density (a bulk specific gravity), and the density is preferably greater than or equal to 0.1 and less than or equal to 0.9 (i.e., from 0.1 to 0.9), is more preferably greater than or equal to 0.3 and less than or equal to 0.8 (i.e., from 0.3 to 0.8), and is particularly preferably 0.5 to 0.8.

In a case where the bulk specific gravity is excessively large, the etching-solution discharging function is superior to the etching-solution holding function, and the surface film (the etching-solution layer) on the patterning sheet increases, and thus, it is difficult to perform regional etching. On the other hand, in a case where the bulk specific gravity is excessively small, the etching-solution holding function is superior to the etching-solution discharging function, and thus, in a consecutive etching treatment, the surface film on the patterning sheet disappears, and the etching-solution is depleted.

That is, in a case where the bulk specific gravity is in the range described above, the etching-solution exists only on the surface 11S of the base sheet 11, and further, the surface film 13 is in contact with the etching target 20B, and thus, even in a case where the etching-solution is moved to the etching target 20B side (that is, the etching-solution is lost from the main surface 11S of the base sheet 11), the loss of the treatment liquid is newly diffused towards the main surface 11S from the inside of the base sheet 11, and in the patterning sheet 10, the surface film 13 formed from the etching-solution is maintained for a long period of time. For this reason, the patterning sheet 10 is preferable for the consecutive etching treatment.

Examples of the material of the particles 12 [Second Polymer] include cellulose or a derivative thereof (for example, ethyl cellulose, hydroxyethyl cellulose, hydroxypropyl methyl cellulose, and carboxymethyl cellulose), or porous silica. Among them, the hydroxypropyl methyl cellulose or the carboxymethyl cellulose is preferable from the viewpoint of the swelling due to the etching-solution or ease in handling.

The particles 12 are kneaded into the matrix resin, but in a case where the amount of matrix resin is 100 parts by weight, an addition amount of the particles is preferably greater than or equal to 5 parts by weight and less than or equal to 50 parts by weight (i.e., from 5 parts by weight to 50 parts by weight), and is more preferably greater than or equal to 10 parts by weight and less than or equal to 25 parts by weight (i.e., from 10 parts by weight to 25 parts by weight).

In such an addition amount, the tacking of the matrix resin is suppressed, and the particles 12 are less likely to be exposed to the main surface 11S of the base sheet 11, and thus, excessive diffusion of the etching-solution with respect to the main surface 11S is prevented. In addition, an etching-solution shortage or a productivity deterioration of the etched structure 20A due to an excessively small addition amount is suppressed.

The thickness of the base sheet 11 is determined by a balance with respect to an average particle diameter of the particles 12. Specifically, it is preferable that the thickness of the base sheet 11 is approximately 3 times to 5 times the average particle diameter of the particles 12.

For example, in a case where the particles 12 are formed from carboxymethyl cellulose having an average particle diameter of 20 μm, it is preferable that the thickness of the base sheet 11 is greater than or equal to 60 μm and less than or equal to 100 μm (i.e., from 60 μm to 100 μm). The thickness of the base sheet 11 is set from the viewpoint of preventing the exposure of the particles 12 and of suppressing the tacking of the matrix resin.

The etching-solution is not particularly limited, insofar as the etching-solution is a solution that dissolves the etching target 20B, specifically, the functional thin film 22.

For example, in a case where the functional thin film 22 is a transparent conductive oxide such as indium oxide or zinc oxide, it is preferable that the etching-solution is a mixed solution of nitric acid and hydrochloric acid. In addition, in a case where the functional thin film 22 is formed from copper, an aqueous solution of iron oxide (III) is preferable as the etching-solution, and in a case where the functional thin film 22 is formed from nickel, nitric acid is preferable as the etching-solution.

In addition, in order to etch the organic compound, it is also considered to use a solvent suitable for the etching, but ketones such as acetone or methyl ethyl ketone are not preferable in consideration of the dissolution of the matrix resin, or the like. In addition, even in a case where an inorganic acid is used as the etching-solution, it is preferable that the concentration is low, and it is sufficient that the etching-solution is an aqueous solution of an inorganic acid having a concentration of preferably less than or equal to 20 weight %, and more preferable less than or equal to 10 weight %, from the viewpoint of suppressing a hydrolysis reaction of the matrix resin.

Note that, a method of holding the etching-solution with respect to the particles 12 is not particularly limited. Examples of the method include a method of forming the matrix resin in which the particles 12 are dispersed into the shape of a sheet, and then, of immersing the matrix resin in the etching-solution.

In addition, the temperature of an etching process may be arbitrarily set in consideration of the volatilization of the etching-solution from the particles 12, thermal decomposition of the matrix resin, heat resistance of the three-dimensional structure, or the like. For example, the temperature may be preferably lower than or equal to 60° C., and may be more preferably lower than or equal to 45° C., from the viewpoint of controlling an etching rate.

In addition, the weight in a case where the patterning sheet 10 is in contact with the etching target 20B, for example, the etching target 20B is pressed to the patterning sheet 10 may be arbitrarily set in consideration of elastic moduli of the patterning sheet 10 and the etching target 20B. For example, the weight may be preferably greater than or equal to 0.2 N/m$^2$ and less than or equal to 10.0 N/m$^2$ (i.e., from 0.2 N/m$^2$ to 10.0 N/m$^2$), or may be more preferably greater than or equal to 0.8 N/m$^2$ and less than or equal to 5.0 N/m$^2$ (i.e., from 0.8 N/m$^2$ to 5.0 N/m$^2$).

In such a range, the etching target, that is, the functional thin film 22 on the vertexes of the protrusions on the surface 20S to be etched, is accurately etched, and the etching of portions other than the target is suppressed.

In addition, in a case where the etching-solution to be impregnated is a self-assembled compound (self-assembled monolayer), for example, the etching-solution is formed only on the vertexes of the protrusions of the surface 20S to be etched, and portions other than vertex portions may be etched by using the etching-solution as a mask.

As described above, the patterning sheet 10, includes: (A) the base sheet 11 formed from the etching-solution permeable first polymer; and (B) the particles 12 formed from the second polymer that absorbs and holds the etching-solution and dispersed in the base sheet 11. Then, in such a patterning sheet 10, (C) the surface film 13 formed by exposing the etching-solution to the main surface 11S of the base sheet 11 is formed.

In addition, the production method of the etched structure 20A that is produced by etching the etching target 20B, includes: the contact step of bringing the surface side of the patterning sheet 10 (specifically, the surface film 13) into contact with the surface 20S to be etched of the etching target 20B; and the detachment step of detaching the surface side from the surface 20S to be etched.

When the etched structure 20A is produced by using such a patterning sheet 10, even in a case where the surface 20S to be etched is a depression-protrusion surface, it is not necessary to position the patterning sheet 10 with respect to the depressions and protrusions. For this reason, the complex etching target 20B is etched in a simple manner, and thus, the etched structure 20A is produced.

In addition, the surface film 13 formed from the etching-solution on the surface side of the patterning sheet 10 is suitably replenished from the particles 12 that hold the etching-solution, and thus, less likely to be depleted, and for example, in one patterning sheet 10, a plurality of etching targets 20B can be consecutively etched. Therefore, the productivity of the etched structure 20A increases.

Note that, the present disclosure is not limited to the embodiment described above, and various changes can be made within the scope of the claims. That is, embodiments obtained by combining technical means that are suitably changed within the scope of the claims are also included in the technical scope of the present disclosure.

EXAMPLES

Hereinafter, the present disclosure will be described in detail by examples, but the present disclosure is not limited to these examples.
<Evaluation>
[Etching Properties]

A sectional surface of an etched structure that was produced in the twentieth etching by repeatedly using a patterning sheet was observed with an SEM, and film thicknesses between a vertex of a protrusion and a bottom of a depression on a depression-protrusion surface were compared. A film thickness of each layer or a particle diameter of particles was measured by performing observation at a magnification of 100,000 times with an SEM (field emission type scanning electron microscope S4800, manufactured by Hitachi High-Technologies Corporation).

Then, the case of satisfying both of [1] a condition in which the film thickness on the bottom of the depression was retained to be greater than or equal to 90% before and after etching and [2] a condition in which the film thickness on the vertex of the protrusion was less than or equal to 7% compared to the film thickness on the bottom was regarded as pass (O), and others cases were regarded as fail (X) (refer to Table 1 described below).

<Preparation of Etching Target>

(A) Formation of Depressions and Protrusions

Polymethyl methacrylate (PMAA, manufactured by Sigma-Aldrich Co. LLC.) was dissolved in toluene at a concentration of 20 weight %, and was applied onto a polyethylene terephthalate (PET) film (Lumirror U48, manufactured by TORAY INDUSTRIES, INC., a thickness of 100 µm) by a spin coating method. After that, drying was performed in an oven of 85° C., and a PMMA layer having a thickness of 50 µm was formed.

Figure 6:
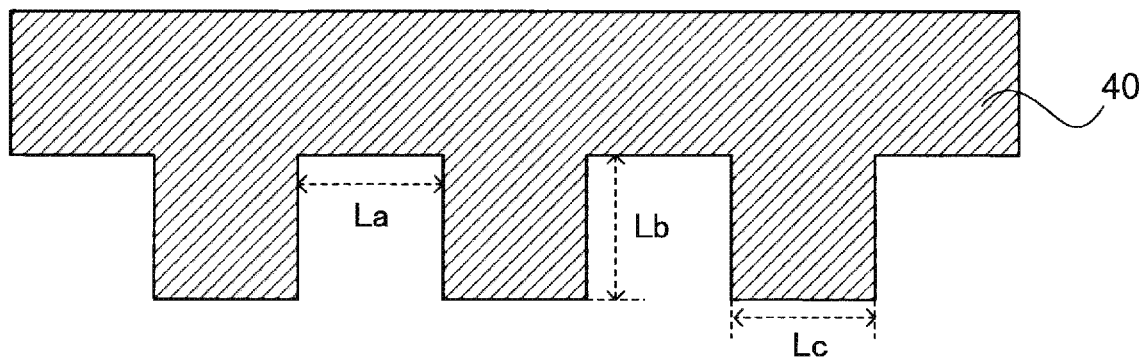
FIG. 6 is a sectional view of a metallic mold that is used in the preparation of the etching target.
Figure 7:
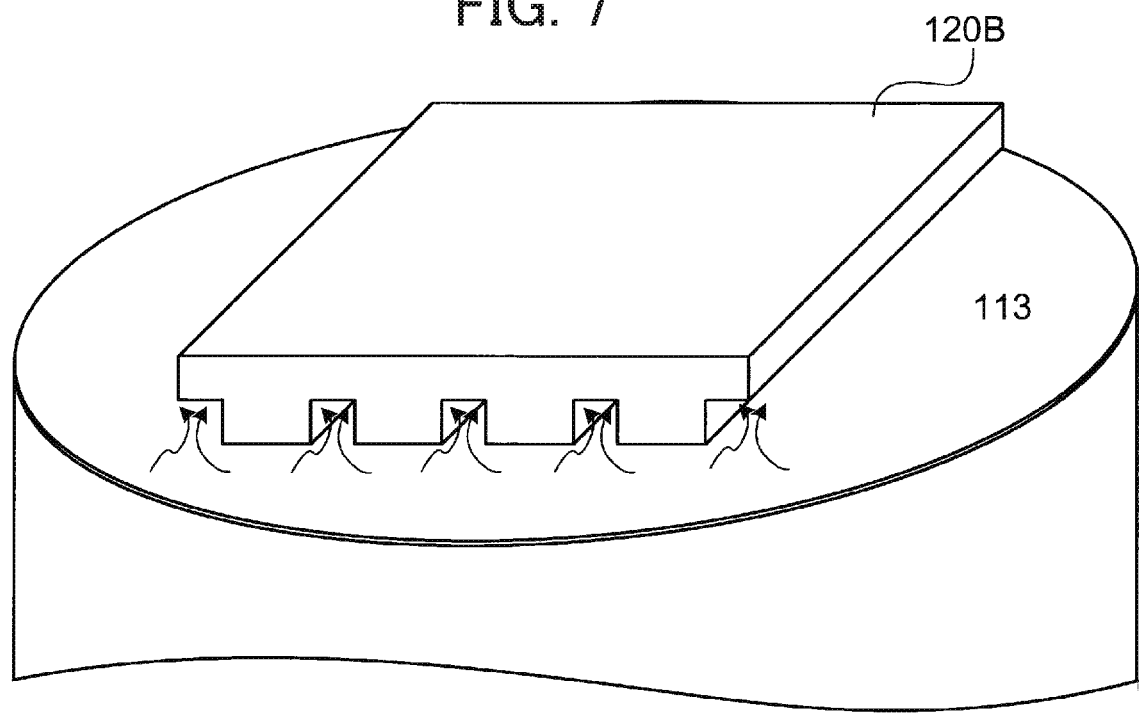
FIG. 7 is a perspective view illustrating etching of the related art with respect to an etching target.

Then, a metallic mold 40 as illustrated in FIG. 6 was prepared from copper {(La): 100 µm, (Lb): 50 µm, and (Lc): 100 µm)}, and the metallic mold was heated to 170° C., and then, was slowly pressed to the PMMA layer with load of 10 kN, and was weighted to a depth of 50 µm. Such a state was retained for 20 minutes, and the temperature of the metallic mold 40 was decreased to 25° C. After that, the metallic mold was slowly detached, and thus, depressions and protrusions were provided to the PMMA layer.

(B) Formation of Functional Thin Film (B-1)

The PMMA layer (a substrate) with depressions and protrusions that was prepared in (A) was put into a vacuum chamber, and an indium tin composite oxide (ITO, tin oxide 10 weight %) was subjected to film formation to have a film thickness of 100 nm by a magnetron sputtering method. The film thickness was measured on the vertex of the depression-protrusion surface. As a film-forming condition, oxygen gas was introduced with respect to argon gas at a flow rate in which a resistance value was minimized (a so-called bottom flow rate), and the film was formed at a pressure of 0.6 Pa, a power density of 0.7 W/cm$^2$, and a substrate temperature of 25° C. After that, the film was put into an oven of 135° C., and was subjected to a thermal treatment for 2 hours, and thus, ITO was crystallized.

(B-2)

The PMMA layer (the substrate) in a depression and protrusion shape that was prepared in (A) was put into a vacuum chamber, and copper (Cu) was subjected to film formation to have a film thickness of 400 nm by a magnetron sputtering method. The film thickness was measured on the vertex of the depression-protrusion surface. As a film-forming condition, argon gas was introduced, and the film was formed at a pressure of 0.6 Pa, a power density of 0.5 W/cm$^2$, and a substrate temperature of 25° C.

<Preparation of Patterning Sheet>

(1) to (4) described below were mixed, and were subjected to defoaming under reduced pressure (at less than or equal to 0.01 MPa for 10 minutes), and thus, a composition was prepared.

(1) to (3) described below were used as the material of a base sheet.

(1) Allyl Terminal Polyoxypropylene
:500 g (Product Name: Kaneka Silyl ACS003, manufactured by KANEKA CORPORATION)
(2) Polyorganohydrogen Siloxane
:33 g (Product Name: CR100, manufactured by KANEKA CORPORATION)
(3) Bis(1,3-Divinyl-1,1,3,3-Tetramethyl Disiloxane) Platinum Complex Catalyst (a platinum content ratio of 3 wt %, a xylene solution)
:0.30 g Any of (4-1) and (4-2) described below was used as the material (4) of the particles.

(4-1) Hydroxypropyl Methyl Cellulose
:50 g (Product Name: TC-5, manufactured by Shin-Etsu Chemical Co., Ltd.)

(4-2) Carboxymethyl Cellulose
:50 g (manufactured by Daicel FineChem Ltd.)

A composition containing (1) to (4) described above was coated with a bar coater to have a thickness of 2 mm, and was subjected to a thermal treatment at 120° C. for 60 minutes, and thus, the base sheet containing the particles was prepared.

Next, the base sheet was impregnated in an etching-solution. Any of (5-1) and (5-2) described below was used as the material (5) of the etching-solution.

(5-1) A transparent conductive film etching-solution (Product Name: ITO-02, manufactured by KANTO CHEMICAL CO., INC.) was diluted 5 times with water to be the etching-solution. The base sheet containing the particles was immersed in the solution, and was left to stand for 15 minutes. Then, the base sheet was taken out, and then, the etching-solution that excessively remained on the surface was slightly wiped out, and thus, the patterning sheet was completed.

(5-2) Iron chloride (III) (manufactured by Kojundo Chemical Laboratory Co., Ltd.) was dissolved in water to be an aqueous solution having a concentration of 5 weight %. The base sheet containing the particles was immersed in the solution, and was left to stand for 15 minutes. Then, the base sheet was taken out, and then, the etching-solution that excessively remained on the surface was slightly wiped off, and thus, the patterning sheet was completed.

<Etching Step>

An etching target including a functional thin film was pressed to the prepared patterning sheet, and was subjected to a treatment for 30 seconds with a load of 1.0 N/m$^2$. The etching target was detached from the patterning sheet, and then, was sufficiently washed with water, and was dried in an oven of 80° C., and thus, an etched structure was completed. Note that, in each of examples and a comparative example described below, 20 etching targets were etched by using one patterning sheet, and etched structures were prepared, and evaluation was performed with respect to the twentieth etched structure.

Examples 1 to 4

As shown in Table 1, in Examples 1 and 3, ITO (B-1 described above) was used, and in Examples 2 and 4, copper (B-2 described above) was used, as the functional thin film of the etched structure (the etching target).

In Examples 1 and 2, hydroxypropyl methyl cellulose (HPMC, (4-1) described above) was used, and in Examples 3 and 4, carboxymethyl cellulose (CMC, (4-2) described above) was used, as the particles of the patterning sheet.

In addition, in Examples 1 and 3, an etching-solution that was suitable for dissolving ITO (5-1 described above) was used, and in Examples 2 and 4, an etching-solution that was suitable for dissolving copper (5-2 described above) was used, as the etching-solution of the patterning sheet.

Comparative Example 1

In Comparative Example 1, the particles were not added, and the patterning sheet was prepared from only (1) to (3) described above. In addition, ITO (B-1 described above) was used as the functional thin film, and the etching-solution that was suitable for dissolving ITO (5-1 described above) was used.

TABLE 1

|  |  | Example 1 | Example 2 | Example 3 | Example 4 | Comparative Example 1 |
|---|---|---|---|---|---|---|
| Evaluation | Etching properties | ○ | ○ | ○ | ○ | x |
| Etched structure | Functional thin film | B-1 | B-2 | B-1 | B-2 | B-1 |
| Patterning sheet | Particles | 4-1 | 4-1 | 4-2 | 4-2 | — |
|  | Etching-solution | 5-1 | 5-2 | 5-1 | 5-2 | 5-1 |

In comparison between each of the examples and the comparative example, it was found that etching properties were excellent by using the patterning sheet containing the particles. It is considered that the reason that the etching properties were regarded as fail in the comparative example was that an etching-solution was not capable of being sufficiently held in the patterning sheet, and thus, the etching-solution was depleted with repeated use.

In the examples, the etching-solution was sufficiently held in the patterning sheet, and in the examples described above, the patterning sheet was not chemically decomposed by an etching-solution, and excellent etching properties were exhibited.

What is claimed is:

1. A patterning sheet, comprising:
   a base sheet formed from a first polymer, the first polymer being permeable to an etching-solution; and
   particles which are formed from a second polymer that absorbs and holds the etching-solution, the particles being dispersed in the base sheet,
   wherein the first polymer contains:
      a polyether-based polymer having an alkenyl group;
      an organohydrosiloxane compound having a hydrosilyl group; and
      a platinum-vinyl siloxane catalyst.

2. The patterning sheet according to claim 1, comprising:
   a surface film formed by exposing the etching-solution to a surface of the base sheet.

3. The patterning sheet according to claim 1, wherein the first polymer contains silicone-modified polyether as a main component.

4. The patterning sheet according to claim 1, wherein the second polymer contains cellulose or a derivative of cellulose selected from the group consisting of ethyl cellulose, hydroxyethyl cellulose, hydroxypropyl methyl cellulose, and carboxymethyl cellulose as a main material.

5. The patterning sheet according to claim 2, wherein the first polymer contains silicone-modified polyether as a main component.

6. The patterning sheet according to claim 2, wherein the second polymer contains cellulose or a derivative of cellulose selected from the group consisting of ethyl cellulose, hydroxyethyl cellulose, hydroxypropyl methyl cellulose, and carboxymethyl cellulose as a main material.

7. The patterning sheet according to claim 3, wherein the second polymer contains cellulose or a derivative of cellulose selected from the group consisting of ethyl cellulose, hydroxyethyl cellulose, hydroxypropyl methyl cellulose, and carboxymethyl cellulose as a main material.

8. The patterning sheet according to claim 5, wherein the second polymer contains cellulose or a derivative of cellulose selected from the group consisting of ethyl cellulose, hydroxyethyl cellulose, hydroxypropyl methyl cellulose, and carboxymethyl cellulose as a main material.

* * * * *